United States Patent
Goto et al.

(10) Patent No.: US 10,787,732 B2
(45) Date of Patent: Sep. 29, 2020

(54) FEPT-C-BASED SPUTTERING TARGET

(71) Applicant: TANAKA KIKINZOKU KOGYO K.K., Chiyoda-ku, Tokyo (JP)

(72) Inventors: Yasuyuki Goto, Tsukuba (JP); Takamichi Yamamoto, Tsukuba (JP); Masahiro Nishiura, Tsukuba (JP); Ryousuke Kushibiki, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 281 days.

(21) Appl. No.: 16/078,003

(22) PCT Filed: Mar. 2, 2017

(86) PCT No.: PCT/JP2017/008344
§ 371 (c)(1),
(2) Date: Aug. 14, 2018

(87) PCT Pub. No.: WO2017/154741
PCT Pub. Date: Sep. 14, 2017

(65) Prior Publication Data
US 2019/0292650 A1   Sep. 26, 2019

(30) Foreign Application Priority Data

Mar. 7, 2016   (JP) .................................. 2016-043888

(51) Int. Cl.
*C23C 14/34* (2006.01)
*C23C 14/14* (2006.01)
(Continued)

(52) U.S. Cl.
CPC ................ *C23C 14/14* (2013.01); *B22F 3/14* (2013.01); *C22C 1/04* (2013.01); *C22C 5/04* (2013.01); *C22C 38/00* (2013.01); *C23C 14/34* (2013.01); *G11B 5/851* (2013.01); *H01J 37/3426* (2013.01); *B22F 1/00* (2013.01); *B22F 3/15* (2013.01); *B22F 2301/25* (2013.01)

(58) Field of Classification Search
CPC .......... B22F 3/14; B22F 3/15; B22F 2301/25; C22C 1/0466; C22C 1/05; C22C 32/0084;
(Continued)

(56) References Cited

U.S. PATENT DOCUMENTS

| | | | |
|---|---|---|---|
| 2014/0021043 A1 | 1/2014 | Miyashita et al. | |
| 2014/0301887 A1 | 10/2014 | Miyashita et al. | |

(Continued)

FOREIGN PATENT DOCUMENTS

| | | |
|---|---|---|
| CN | 104145306 A | 11/2014 |
| JP | 3950838 B | 8/2007 |

(Continued)

OTHER PUBLICATIONS

PCT, English Translation of the International Preliminary Report on Patentability for PCT/JP2017/008344, dated Sep. 7, 2018.
(Continued)

*Primary Examiner* — Rodney G McDonald
(74) *Attorney, Agent, or Firm* — Orrick Herrington & Sutcliffe LLP; Joseph A. Calvaruso; K. Patrick Herman

(57) ABSTRACT

Through the present invention, a thin film containing an FePt-based alloy and carbon, the thin film being capable of being used as a magnetic recording medium, is enabled to be formed using one target, and amount of particles is enabled to be reduced. An FePt—C-based sputtering target containing Fe, Pt, and C, wherein the FePt—C-based sputtering target has a structure in which a C phase substantially being C is dispersed in an FePt-based alloy phase containing 33 mol % or more and 60 mol % or less of Pt with the balance substantially being Fe, an average value of the size indices a of the C phase is 4.0 μm or more and 9.0 μm or less, and an average value of the nonspherical indices b of the C phase is 3.0 or more.

20 Claims, 5 Drawing Sheets

(51) Int. Cl.
*B22F 3/14* (2006.01)
*C22C 5/04* (2006.01)
*H01J 37/34* (2006.01)
*C22C 1/04* (2006.01)
*G11B 5/851* (2006.01)
*C22C 38/00* (2006.01)
*B22F 3/15* (2006.01)
*B22F 1/00* (2006.01)

(58) Field of Classification Search
CPC ........... C22C 32/00; C22C 38/00; C22C 5/04; C23C 14/0688; C23C 14/14; C23C 14/3414; G11B 5/851; H01J 37/3426
USPC .................................... 204/298.12, 298.13
See application file for complete search history.

(56) References Cited

U.S. PATENT DOCUMENTS

| | | |
|---|---|---|
| 2014/0318954 A1 | 10/2014 | Miyashita et al. |
| 2014/0318955 A1 | 10/2014 | Miyashita et al. |
| 2014/0322062 A1 | 10/2014 | Miyashita et al. |
| 2014/0322063 A1 | 10/2014 | Miyashita et al. |
| 2014/0346039 A1 | 11/2014 | Ogino |
| 2015/0060268 A1 | 3/2015 | Ogino |
| 2016/0013033 A1 | 1/2016 | Goto et al. |

FOREIGN PATENT DOCUMENTS

| | | |
|---|---|---|
| JP | 2012-102387 A | 5/2012 |
| JP | 2012-214874 A | 11/2012 |
| JP | 2014-120180 A | 6/2014 |
| JP | 2015-175025 A | 10/2015 |
| WO | WO 2013/105648 A1 | 7/2013 |
| WO | WO 2014/013920 A1 | 1/2014 |
| WO | WO 2014/132746 A1 | 9/2014 |
| WO | WO 2014/175392 A1 | 10/2014 |

OTHER PUBLICATIONS

PCT, International Search Report for PCT/JP2017/008344, dated May 23, 2017.

FIG.3
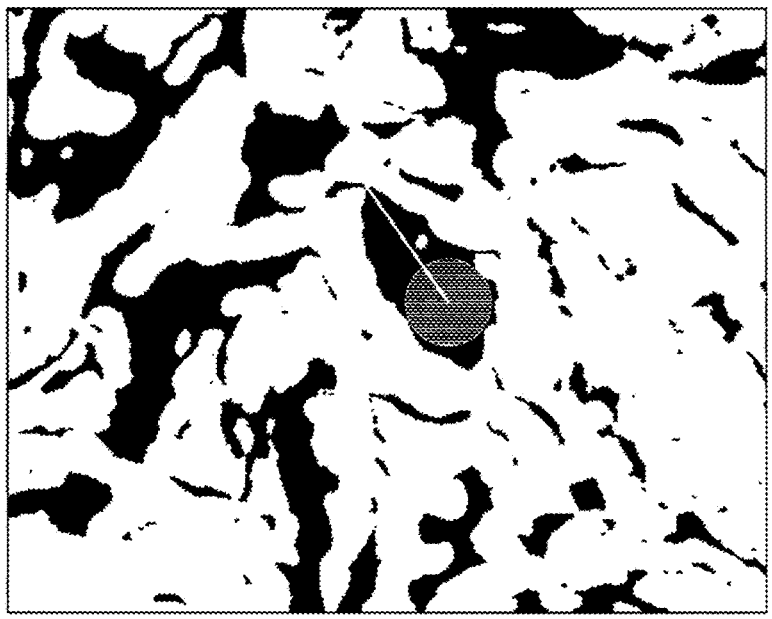
FIG.4A
Circumscribed (OK)
FIG.4B
Inscribed in one another (NG)
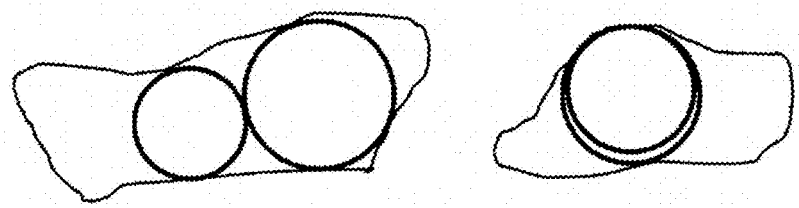
FIG.4C
Cross one another (NG)
FIG.4D
One encompasses another (NG)
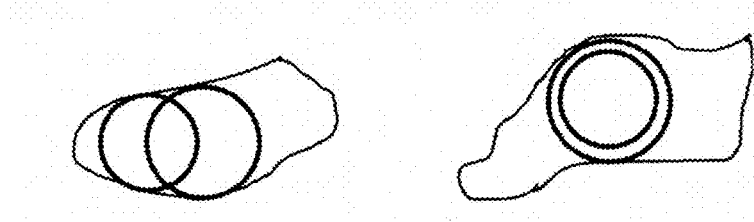

FEPT-C-BASED SPUTTERING TARGET

TECHNICAL FIELD

The present invention relates to a FePt—C-based sputtering target. Hereinafter, the FePt—C-based sputtering target may be referred to simply as a "sputtering target" or a "target".

BACKGROUND ART

An FePt alloy can be provided with the fct (Ordered Face Centered Tetragonal) structure which has high crystal magnetic anisotropy by heat-treating at an elevated temperature (for example, at 600° C. or higher), and therefore an FePt alloy has been highlighted as a magnetic recording medium. To make FePt particles smaller and more uniform in the thin film of the FePt alloy, it is proposed that a predetermined quantity of carbon (C) be included into the thin film of the FePt alloy (for example, Patent Literature 1).

However, the formation method of the FePtC thin film, described in the Patent Literature 1, is the method of vapor-depositing Fe, Pt, and C simultaneously on an MgO (100) substrate by using the Fe target of a 2-inch diameter, C target of a 2-inch diameter, and the Pt target of 5 mm in height and width. In this method, it is difficult to obtain the film whose composition is controlled strictly. Additionally, three targets are required and each target needs a cathode, a power supply, etc, and so the cost of equipment becomes high while the preparatory work of sputtering takes time and effort.

In contrast, Patent Literature 2 discloses an sputtering target for forming a magnetic recording medium film that alone can be used to form an FePt—C thin film without using a plurality of targets and also discloses a method for manufacturing the FePt—C-based sputtering target. Patent Literature 3 discloses an FePt—C-based sputtering target that alone can be used to form an FePtC-based thin film containing a large amount of carbon without using a plurality of targets and also discloses a method for manufacturing the sputtering target. Some sputtering targets have been proposed, each of which alone can be used to form an FePtC-based thin film that is receiving attention as a novel magnetic recording medium.

However, it is generally required for a sputtering target to cause a reduced amount of particles during sputtering. This is also required for a sputtering target that alone may be used to form an FePtC-based thin film.

As an FePt—C-based sputtering target with a reduced amount of particles generated during sputtering, there has been proposed in Patent Literature 4 an FePt—C-based sputtering target having a structure in which C primary particles in the target are dispersed so as not to be in contact with each other.

CITATION LIST

Patent Literature

Patent Literature 1: Japanese Patent No. 3950838
Patent Literature 2: Japanese Patent Application Laid-Open Publication No. 2012-102387
Patent Literature 3: Japanese Patent Application Laid-Open Publication No. 2012-214874
Patent Literature 4: PCT International Publication No. WO 2014/132746

SUMMARY OF INVENTION

Technical Problem

In the FePt—C-based sputtering target, however, the particles generated during sputtering are demanded to be close to zero as much as possible. Thus, there is still a demand that the generation of particles is further suppressed.

The present invention has been made in view of the foregoing circumstances, and it is an object to provide an FePt—C-based sputtering target that alone can be used to forma thin film containing an FePt-based alloy and carbon, the thin film being capable of being used as a magnetic recording medium, without using a plurality of targets, and that causes a reduced amount of particles during sputtering.

Solution to Problem

As a result of intensive research to achieve the aforementioned object, the present inventors found out that the aforementioned object is achievable by the following FePt—C-based sputtering targets, and the present inventors created the present invention.

Namely, a first aspect of an FePt—C-based sputtering target according to the present invention is an FePt—C-based sputtering target containing Fe, Pt, and C, wherein the FePt—C-based sputtering target has a structure in which a C phase substantially being C is dispersed in an FePt-based alloy phase containing 33 mol % or more and 60 mol % or less of Pt with the balance substantially being Fe, and when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

The "balance substantially being Fe" used herein includes not only a case where the balance is only Fe but also a case where the balance includes unavoidable impurities in addition to Fe. The "C phase substantially being C" used herein includes not only a C phase being only C but also a C phase having unavoidable impurities in addition to C.

The "size index a of a C phase" and "nonspherical index b of a C phase" used herein are calculated in accordance with procedures (1) to (6) described later (Example 1).

The "10 images taken at 10 locations" used herein means 10 binarized images obtained by the procedure (2) described later (Example 1).

In the present application, the term "FePt-based alloy" means an alloy containing Fe and Pt as main components and is intended to encompass not only a binary alloy containing only Fe and Pt but also ternary and higher alloys containing Fe and Pt as main components and an additional metal element(s) other than Fe and Pt. The term "FePt—C-based sputtering target" means a sputtering target containing Fe, Pt, and C as main components and is intended to encompass a sputtering target further containing an element other than the main components Fe, Pt, and C. The term "FePtC-based thin film" means a thin film containing Fe, Pt, and C as main components and is intended to encompass a thin film further containing an element other than the main components Fe, Pt, and C. The term "FePtC-based layer" means a layer containing Fe, Pt, and C as main components and is intended to encompass a layer further containing an element other than the main components Fe, Pt, and C.

A second aspect of an FePt—C-based sputtering target containing Fe, Pt, and C and further containing at least one element other than Fe and Pt, wherein the FePt—C-based sputtering target has a structure in which a C phase substantially being C is dispersed in an FePt-based alloy phase containing 33 mol % or more and less than 60 mol % of Pt and more than 0 mol % and 20 mol % or less of the at least one element other than Fe and Pt with the balance being Fe and unavoidable impurities and with the total amount of Pt and the at least one element being 60 mol % or less, and when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

In the second aspect of an FePt—C-based sputtering target according to the present invention, the one or more kinds of elements other than Fe and Pt may be one or more kinds of Cu, Ag, Rh, Au, Mn, Ni, Co, Pd, Cr, V, and B.

In the first and second aspects of an FePt—C-based sputtering target according to the present invention, a content percentage of C in the C phase relative to the entire target is preferably 10 mol % or more and 60 mol % or less.

A third aspect of an FePt—C-based sputtering target containing Fe, Pt, C, and oxide, wherein the FePt—C-based sputtering target has a structure in which a C phase substantially being C and an oxide phase substantially being oxide are dispersed in an FePt-based alloy phase containing 33 mol % or more and 60 mol % or less of Pt with the balance substantially being Fe, and when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more The "oxide phase substantially being an oxide" used herein includes not only an oxide phase being only an oxide but also an oxide phase having unavoidable impurities in addition to the oxide.

A fourth aspect of an FePt—C-based sputtering target containing Fe, Pt, C, and oxide and further containing at least one element other than Fe and Pt, wherein the FePt—C-based sputtering target has a structure in which a C phase substantially being C and an oxide phase substantially being oxide are dispersed in an FePt-based alloy phase containing 33 mol % or more and less than 60 mol % of Pt and more than 0 mol % and 20 mol % or less of the at least one element other than Fe and Pt with the balance being Fe and unavoidable impurities and with the total amount of Pt and the at least one element being 60 mol % or less, and when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

In the fourth aspect of an FePt—C-based sputtering target according to the present invention, the one or more kinds of elements other than Fe and Pt may be one or more kinds of Cu, Ag, Rh, Au, Mn, Ni, Co, Pd, Cr, V, and B.

In the third and fourth aspects of an FePt—C-based sputtering target according to the present invention, it is preferable that a content percentage of a total sum of C in the C phase and the oxide in the oxide phase relative to the entire target is 10 mol % or more and 60 mol % or less, a content percentage of C in the C phase relative to the entire target is 5 mol % or more and 50 mol % or less, and a content percentage of the oxide in the oxide phase relative to the entire target is 1 mol % or more and 25 mol % or less.

In the third and fourth aspects of an FePt—C-based sputtering target according to the present invention, the oxide may contain at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $Fe_3O_4$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

In the first to fourth aspects of an FePt—C-based sputtering target according to the present invention, the FePt—C-based sputtering target preferably has a relative density of 90% or larger.

Advantageous Effects of Invention

An FePt—C-based sputtering target according to the present invention alone can be used to form a thin film containing an FePt-based alloy and carbon, the thin film being capable of being used as a magnetic recording medium, without using a plurality of targets, and an FePt—C-based sputtering target according to the present invention can cause a reduced amount of particles during sputtering.

BRIEF DESCRIPTION OF THE DRAWINGS

FIG. 3 is a binarized image showing an enlarged area including one inscribed circle described in FIG. 2.

FIG. 4 is a diagram for describing a definition of the "inscribed circle of C phase" used in the present application.

DESCRIPTION OF EMBODIMENTS

Figure 1:
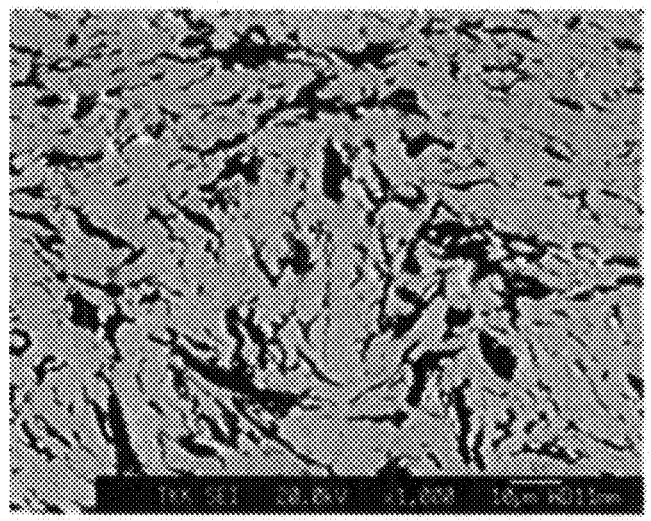
FIG. 1 is a SEM photograph (a SEM photograph in which a field of view of 121 μm×97 μm was taken with 1,000× magnification, and the scale in this photograph is 10 μm) showing a cross section in a thickness direction of a sintered body of Example 1 (a cross section of the sintered body in a direction in which a pressure was applied during hot pressing).

Embodiments of the present invention will next be described in detail.

1. First Embodiment 1-1. Components and Structure of Sputtering Target

An FePt—C-based sputtering target according to a first embodiment of the present invention contains Fe, Pt, and C. The FePt—C-based sputtering target is characterized in that it has a structure in which a C phase substantially being C is dispersed in an FePt-based alloy phase containing 33 mol % or more and 60 mol % or less of Pt with the balance substantially being Fe, and when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more. In the present description, the phrase "α or more and β or less" may be described as "α to β."

1-1-1. FePt-Based Alloy

The FePt-based alloy can have an fct structure with high magnetocrystalline anisotropy when subjected to heat treatment at high temperature (e.g., 600° C. or higher). Therefore, the FePt-based alloy has a role in serving as a recording layer of a magnetic recording medium and is a main component of the FePt—C-based sputtering target according to the embodiment of the present invention.

The reason that the content of Pt in the FePt-based alloy phase is specified as 33 to 60 mol % is that, if the content of Pt in the FePt-based alloy phase is not 33 to 60 mol %, an fct (face centered tetragonal) structure may not appear. From the view point of allowing the fct (face centered tetragonal) structure to appear reliably in the FePt-based alloy phase, the content of Pt in the FePt-based alloy phase is preferably 45 to 55 mol %, more preferably 49 to 51 mol %, and particularly preferably 50 mol %.

1-1-2. C (Carbon)

C (carbon) can form the partitions for separating the FePt-based alloy grains, which are magnetic grains, from each other in a FePtC-based layer obtained by sputtering, and has a role in reducing and uniformizing the size of the FePt-based alloy grains in the FePtC-based layer. C (carbon) is one of main components in the FePt—C-based sputtering target according to the first embodiment.

The content percentage of C in C (carbon) phase relative to the entire target is preferably 10 to 60 mol %. When the content percentage of C in C (carbon) phase relative to the entire target is 10 to 60 mol %, the C (carbon) serves as partition walls that separate the grains of the FePt-based alloy, which are magnetic grains, from each other in the FePtC-based layer obtained by sputtering, so that the certainty of achievement of the effect of reducing the grains of the FePt-based alloy in size uniformly can be increased. If the content percentage of C in C (carbon) phase relative to the entire target is less than 10 mol %, this effect may not be achieved sufficiently. If the content percentage of C in C (carbon) phase relative to the entire target exceeds 60 mol %, the number of grains of the FePt-based alloy per unit volume in the FePtC-based layer obtained by sputtering becomes small, and this is disadvantageous in terms of storage capacity. From the viewpoint of increasing the certainty of achievement of the effect of reducing the grains of the FePt-based alloy in size uniformly in the FePtC-based layer and from the viewpoint of the storage capacity of the FePtC-based layer to be formed, the content percentage of C in C (carbon) phase relative to the entire target is more preferably 20 to 55 mol %, further preferably 30 to 55 mol %, and particularly preferably 35 to 50 mol %.

The C (carbon) phase in a target may be identified using EPMA.

1-1-3. Structure of Target

The FePt—C-based sputtering target according to the first embodiment has a structure in which a C phase substantially being C is dispersed in an FePt-based alloy phase containing 33 mol % or more and 60 mol % or less of Pt with the balance substantially being Fe. When in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

Note that the average value of the nonspherical indices b of the C phase in a target generally obtained is usually 10.0 or less, 15.0 or less in most cases, and 20.0 at a maximum.

In the FePt—C-based sputtering target according to the first embodiment, the average value of the size indices a of the C phase is 4.0 μm or more and 9.0 μm or less, and the C phase has an appropriate size that facilitates covering of the periphery of the C phase with the FePt-based alloy that is a matrix metal. Since the average value of the nonspherical indices b of the C phase is 3.0 or more, the C phase in the target has a long, thin shape as compared to a spherical shape. Thus, the surface area per unit volume of the C phase is larger than that of the spherical shape. Accordingly, the C phase in the target is likely to be favorably bonded to the FePt-based alloy, which is the matrix metal.

Therefore, the number of particles generated during sputtering using the FePt—C-based sputtering target according to the first embodiment is reduced. This has been demonstrated as shown in Examples described later.

As for the relative density of the target, the larger the value of the relative density, the smaller the amount of voids in the target. Therefore, the larger value of the relative density is preferable in terms of performing sputtering favorably. Specifically, the relative density of the target is preferably 90% or larger and more preferably 95% or larger.

From the viewpoint that the periphery of the C phase is more easily covered with the FePt-based alloy, which is the matrix metal, the average value of the size indices a of the C phase is preferably 5.0 μm or more and 8.0 μm or less. From the viewpoint of increasing the surface area per unit volume of the C phase, the average value of the nonspherical indices b of the C phase is preferably 5.0 or more.

1-1-4. Element Other than Fe and Pt

The FePt—C-based sputtering target according to the first embodiment contains only Fe and Pt as metal elements. However, the FePt-based alloy phase may contain an element other than Fe and Pt (modification of the first embodiment).

In this case, from the viewpoint of allowing the fct (face centered tetragonal) structure to appear reliably in the FePt-based alloy phase, the FePt-based alloy phase may contain 33 mol % or more and less than 60 mol % of Pt, more than 0 mol % and 20 mol % or less of the at least one element other than Fe and Pt with the balance being Fe and unavoidable impurities and with the total amount of Pt and the at least one element being 60 mol % or less.

In this modification (in which the FePt-based alloy phase contains an element other than Fe and Pt), from the viewpoint of allowing the fct (face centered tetragonal) structure to appear more reliably in the FePt-based alloy phase, the content of Pt in the FePt-based alloy phase is preferably 45 to 55 mol % and more preferably 49 to 51 mol %. However, it is premised that the total content of Fe and Pt is less than 100 mol %, the total content of the at least one element other than Fe and Pt is more than 0 mol % and 20 mol % or less, and the sum of the content of Pt and the total content of the at least one element other than Fe and Pt is 60 mol % or less.

In the first embodiment, examples of the element other than Fe and Pt that can be contained in the FePt-based alloy phase are Cu, Ag, Rh, Au, Mn, Ni, Co, Pd, Cr, V, and B. One or more of these elements may be contained in the target.

When Cu is contained, the temperature of the heat treatment for converting the crystal structure of the FePt-based alloy to the fct structure can be reduced (to, for example, 600° C.), so that the cost of the heat treatment on an FePtC-based layer obtained by sputtering can be reduced. In addition, the addition of Cu may allow the crystal structure of the obtained FePtC-based layer to be converted to the fct structure by heat generated during sputtering without additional heat treatment.

1-2. Manufacturing Method

The FePt—C-based sputtering target according to the first embodiment can be manufactured by: mixing a C powder containing C particles, of which an average particle diameter is 8 μm or more and 60 μm or less and of which shape is nonspherical, to an FePt-based alloy powder having an average particle diameter of 60 μm or less and containing 33 mol % or more and 60 mol % or less of Pt with the balance substantially being Fe to thereby produce a powder mixture for pressure sintering; and then molding the produced powder mixture for pressure sintering while the powder mixture is heated under application of pressure.

If the average particle diameter of the FePt-based alloy powder exceeds 60 μm, the relative density of the resulting target may not be sufficiently increased, so that the periphery of the C particles may not be sufficiently covered with the FePt-based alloy. Thus the number of particles generated when sputtering is performed using the resulting sputtering target may increase. From the viewpoint of sufficiently increasing the relative density of the resulting target, so as to sufficiently cover the periphery of the C particles with the FePt-based alloy, the average particle diameter of the FePt-based alloy powder to be used in the manufacture of the FePt—C-based sputtering target according to the first embodiment is preferably 55 μm or less, and more preferably 50 μm or less.

The C powder used contains C particles of which an average particle diameter is 8 μm or more and 60 μm or less and of which shape is nonspherical. When the C powder containing such C particles is used, the C phase in the resulting target has an appropriate size and shape. As demonstrated in Examples described later, the number of particles generated during sputtering is reduced. From the viewpoint of allowing the C phase to have an appropriate size and shape in the resulting target to reduce the number of particles generated during sputtering, the average particle diameter of the C powder to be used in the manufacture of the FePt—C-based sputtering target according to the first embodiment is preferably 10 µm or more and 55 µm or less, and more preferably 12 µm or more and 52 µm or less. The same is applied to the other examples of the manufacturing method to be described later.

In the present application, the average particle diameter of powder is a median diameter (a particle diameter at which a cumulative frequency curve of a particle diameter distribution reaches 50%) in a particle diameter distribution. The particle diameter distribution is obtained by measuring the powder by a laser diffraction/scattering method to obtain a volume distribution of the particles contained in the powder, and converting the volume distribution to a particle diameter distribution assuming that the shape of the particles is spherical.

In the present application, the average particle diameter of particles is a median diameter (a particle diameter at which a cumulative frequency curve of a particle diameter distribution reaches 50%) in a particle diameter distribution. The particle diameter distribution is obtained by measuring a cluster of the particles (i.e., powder) by a laser diffraction/scattering method to obtain a volume distribution of the particles contained in the cluster of the particles (i.e., powder), and converting the volume distribution to a particle diameter distribution assuming that the shape of the particles is spherical.

In the present application, "C particles of which shape is nonspherical" means that the C particles have not only a surface formed from a smooth spherical surface but also a surface having local irregularities, projections, and the like so that these shapes may exert an anchoring effect to the matrix metal.

No particular limitation is imposed on the atmosphere when the FePt-based alloy powder and the C powder are mixed to produce the powder mixture for pressure sintering, and the FePt-based alloy powder and the C powder may be mixed in air.

Instead of the FePt-based alloy powder, a single Fe powder with an average particle diameter of 20 µm or less and a single Pt powder with an average particle diameter of 5 µm or less may be used. In this case, the single Fe powder and the single Pt powder are weighed such that the ratio of the amount of Pt to the total amount of Fe and Pt is 33 mol % or more and 60 mol % or less. Then the weighed single Fe powder, the weighed single Pt powder, and a C powder containing C particles, of which an average particle diameter is 8 µm or more and 60 µm or less and of which shape is nonspherical are mixed to thereby produce a powder mixture for pressure sintering. Then the produced powder mixture for pressure sintering is molded while the powder mixture is heated under application of pressure.

From the viewpoint of sufficiently increasing the relative density of the resulting target, so as to sufficiently cover the periphery of the C particles with Fe and Pt, the average particle diameter of the single Fe powder to be used in the manufacture of the FePt—C-based sputtering target according to the first embodiment is preferably 15 µm or less, and more preferably 10 µm or less. From the similar viewpoint, the average particle diameter of the single Pt powder to be used in the manufacture of the FePt—C-based sputtering target according to the first embodiment is preferably 4 µm or less, and more preferably 3 µm or less.

However, since the activity of the single Fe powder is high, it may ignite in air and therefore must be handled with sufficient care. By alloying Fe and Pt to form an FePt-based alloy powder, the activity of the Fe can be lowered even though it is in powder form. The use of the FePt-based alloy powder is more preferred from this point of view.

No particular limitation is imposed on the method for molding the powder mixture for pressure sintering produced as described above while the powder mixture is heated under application of pressure. For example, a hot pressing method, a hot isostatic pressing method (HIP method), a spark plasma sintering method (SPS method), etc. may be used. Preferably, when implementing the present invention, such a molding method is performed in a vacuum or an inert gas atmosphere. In this case, even when the powder mixture contains a certain amount of oxygen, the amount of oxygen in the obtained sintered product decreases.

When the FePt-based alloy phase contains an element other than Fe and Pt as in the modification of the first embodiment, an FePt-based alloy powder having an average particle diameter of 60 µm or less and containing 33 mol % or more and less than 60 mol % of Pt and more than 0 mol % and 20 mol % or less of at least one metal element other than Fe and Pt with the balance substantially being Fe and with the total amount of Pt and the at least one element being 60 mol % or less may be used instead of the FePt-based alloy powder, having an average particle diameter of 60 µm or less, and containing 33 mol % or more and 60 mol % or less of Pt with the balance substantially being Fe. The subsequent steps are the same as those when the FePt-based alloy phase does not contain an element other than Fe and Pt (as in the first embodiment).

Also in manufacturing the target of modification of the first embodiment, from the viewpoint of sufficiently increasing the relative density of the resulting target, so as to sufficiently cover the periphery of the C particles with the FePt-based alloy, the average particle diameter of the FePt-based alloy powder to be used is preferably 55 µm or less, and more preferably 50 µm or less.

In manufacturing the target of modification of the first embodiment, an FePt-based alloy powder having an average particle diameter of 60 µm or less and containing Pt with the balance substantially being Fe, and a powder containing at least one element other than Fe and Pt with the balance being unavoidable impurities and having an average particle diameter of 30 µm or less may be used.

In this case, an FePt-based alloy powder having an average particle diameter of 60 µm or less and containing Pt with the balance substantially being Fe, and a powder containing at least one element other than Fe and Pt with the balance being unavoidable impurities and having an average particle diameter of 30 µm or less are weighed such that the ratio of the amount of the Pt with respect to the total amounts of the Pt, the Fe, and the at least one metal element is 33 mol % or more and less than 60 mol %, the ratio of the amount of the at least one metal element with respect to the total amount is more than 0 mol % and 20 mol % or less, and the ratio of the sum of the amounts of the Pt and the at least one metal element with respect to the total amount is 60 mol % or less. Then the weighed FePt-based alloy powder, the weighed powder containing the at least one metal element, and a C powder containing C particles, of which an average particle diameter is 8 µm or more and 60 µm or less and of which shape is nonspherical are mixed to thereby produce a powder mixture for pressure sintering. Then the produced powder mixture for pressure sintering is molded while the powder mixture is heated under application of pressure.

Also in this case, from the viewpoint of sufficiently increasing the relative density of the resulting target, so as to sufficiently cover the periphery of the C particles with the FePt-based alloy and the powder containing at least one element other than Fe and Pt, the average particle diameter of the FePt-based alloy powder to be used is preferably 55 μm or less, and more preferably 50 μm or less, and the average particle diameter of the powder containing at least one element other than Fe and Pt is preferably 25 μm or less, and more preferably 20 μm or less.

In manufacturing the target of modification of the first embodiment, a single Pt powder containing unavoidable impurities and having an average particle diameter of 5 μm or less, a single Fe powder containing unavoidable impurities and having an average particle diameter of 20 μm or less, and a powder containing at least one element other than Fe and Pt with the balance being unavoidable impurities and having an average particle diameter of 30 μm or less may be used.

In this case, the single Pt powder having an average particle diameter of 5 μm or less, the single Fe powder having an average particle diameter of 20 μm or less, and the powder containing at least one element other than Fe and Pt and having an average particle diameter of 30 μm or less are weighed such that the ratio of the amount of the Pt with respect to the total amounts of the Pt, the Fe, and the at least one element is 33 mol % or more and less than 60 mol %, the ratio of the amount of the at least one element with respect to the total amount is more than 0 mol % and 20 mol % or less, and the ratio of the sum of the amounts of the Pt and the at least one element with respect to the total amount is 60 mol % or less. Then the weighed single Pt powder, the weighed single Fe powder, the weighed powder containing at least one metal element, and a C powder containing C particles, of which an average particle diameter is 8 μm or more and 60 μm or less and of which shape is nonspherical are mixed to thereby produce a powder mixture for pressure sintering. Then the produced powder mixture for pressure sintering is molded while the powder mixture is heated under application of pressure.

Also in this case, from the viewpoint of sufficiently increasing the relative density of the resulting target, so as to sufficiently cover the periphery of the C particles with the single Pt powder, the single Fe powder and the powder containing at least one element other than Fe and Pt, the average particle diameter of the single Pt powder to be used is preferably 4 μm or less, and more preferably 3 μm or less, the average particle diameter of the single Fe powder to be used is preferably 15 μm or less, and more preferably 10 μm or less, and the average particle diameter of the powder containing at least one element other than Fe and Pt is preferably 25 μm or less, and more preferably 20 μm or less.

1-3. Effects

The FePt—C-based sputtering target according to the first embodiment has a structure in which a C phase substantially being C is dispersed in an FePt-based alloy phase containing 33 mol % or more and 60 mol % or less of Pt with the balance substantially being Fe. When in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

In the FePt—C-based sputtering target according to the first embodiment, the average value of the size indices a of the C phase is 4.0 μm or more and 9.0 μm or less, and the C phase has an appropriate size that facilitates covering of the periphery of the C phase with the FePt-based alloy that is a matrix metal. Since the average value of the nonspherical indices b of the C phase is 3.0 or more, the C phase in the target has a long, thin shape as compared to a spherical shape. Thus, the surface area per unit volume of the C phase is larger than that of the spherical shape. Accordingly, the C phase in the target is likely to be favorably bonded to the FePt-based alloy, which is the matrix metal.

Therefore, the number of particles generated during sputtering using the FePt—C-based sputtering target according to the first embodiment is reduced. This has been demonstrated as shown in Examples described later.

In the manufacturing method according to the first embodiment, since a sintering process is used instead of a casting process, the content of C relative to the total amount of the target can be increased, so that an FePt—C-based sputtering target in which a content percentage of C relative to the entire target is 10 mol % or more and 60 mol % or less can be produced. Therefore, by performing sputtering using the FePt—C-based sputtering target according to the first embodiment, a thin film containing an FePt-based alloy and much carbon as to be capable of being used as a magnetic recording medium can be formed using only the above target alone, i.e., without using a plurality of targets.

2. Second Embodiment

An FePt—C-based sputtering target according to a second embodiment will be described below, but the description of the same content as in the FePt—C-based sputtering target according to the first embodiment will be appropriately omitted.

2-1. Components and Structure of Sputtering Target

The FePt—C-based sputtering target according to the first embodiment contains C (carbon) in addition to the alloy components (Fe and Pt). However, an FePt—C-based sputtering target according to a second embodiment contains C (carbon) and a metal oxide in addition to the alloy components (Fe and Pt).

Namely, an FePt—C-based sputtering target according to a second embodiment of the present invention contains Fe, Pt, C, and oxide. The FePt—C-based sputtering target is characterized in that it has a structure in which a C phase substantially being C and an oxide phase substantially being oxide are dispersed in an FePt-based alloy phase containing 33 mol % or more and 60 mol % or less of Pt with the balance substantially being Fe, and when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

2-1-1. FePt-Based Alloy

The description of the FePt-based alloy in the FePt—C-based sputtering target according to the second embodiment to be mentioned here is overlapped with the content described in "1-1-1. FePt-based Alloy" in the first embodiment, and accordingly the description thereof will be omitted.

2-1-2. C and Oxide

C (carbon) and the oxide can form the partitions for separating the FePt-based alloy grains, which are magnetic grains, from each other in an FePtC-based layer obtained by sputtering, and have a role in reducing and uniformizing the size of the FePt-based alloy grains in the FePtC-based layer. C and the oxide are parts of main components in the FePt—C-based sputtering target according to the second embodiment.

The content percentage of a total sum of C in the C (carbon) phase and the oxide in the oxide phase relative to the entire target is preferably 10 to 60 mol %. When the content percentage of a total sum of C in the C (carbon) phase and the oxide in the oxide phase relative to the entire target is 10 to 60 mol %, the C (carbon) and the oxide serve as partition walls that separate the grains of the FePt-based alloy, which are magnetic grains, from each other in the FePtC-based layer obtained by sputtering, so that the certainty of achievement of the effect of reducing the grains of the FePt-based alloy in size uniformly can be increased. If the content percentage of a total sum of C in the C (carbon) phase and the oxide in the oxide phase relative to the entire target is less than 10 mol %, this effect may not be achieved sufficiently. If the content percentage of a total sum of C in the C (carbon) phase and the oxide in the oxide phase relative to the entire target exceeds 60 mol %, the number of grains of the FePt-based alloy per unit volume in the FePtC-based layer obtained by sputtering becomes small, and this is disadvantageous in terms of storage capacity. From the viewpoint of increasing the certainty of achievement of the effect of reducing the grains of the FePt-based alloy in size uniformly in the FePtC-based layer and from the viewpoint of the storage capacity of the FePtC-based layer to be formed, the content percentage of a total sum of C in the C (carbon) phase and the oxide in the oxide phase relative to the entire target is more preferably 15 to 55 mol %, further preferably 20 to 50 mol %, and particularly preferably 25 to 45 mol %.

From the viewpoint of the balance between C and the oxide contained in the target, however, the content percentage of C relative to the entire target is preferably 5 to 50 mol %, more preferably 10 to 45 mol %, further preferably 15 to 40 mol %, and particularly preferably 20 to 35 mol %. The content percentage of the oxide relative to the entire target is preferably 1 to 25 mol %, more preferably 3 to 22 mol %, further preferably 5 to 19 mol %, and particularly preferably 7 to 16 mol %.

In the second embodiment, the oxide may contain, for example, at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $Fe_3O_4$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

The C (carbon) phase and the oxide phase in a target may be identified using EPMA.

2-1-3. Structure of Target

The FePt—C-based sputtering target according to the second embodiment of the present invention has a structure in which a C phase substantially being C and an oxide phase substantially being oxide are dispersed in the FePt-based alloy phase containing 33 to 60 mol % of Pt with the balance substantially being Fe. When in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

Note that the average value of the nonspherical indices b of the C phase in a target generally obtained is usually 10.0 or less, 15.0 or less in most cases, and 20.0 at a maximum.

In the FePt—C-based sputtering target according to the second embodiment, the average value of the size indices a of the C phase is 4.0 μm or more and 9.0 μm or less, and the C phase has an appropriate size that facilitates covering of the periphery of the C phase with the FePt-based alloy that is a matrix metal. Since the average value of the nonspherical indices b of the C phase is 3.0 or more, the C phase in the target has a long, thin shape as compared to a spherical shape. Thus, the surface area per unit volume of the C phase is larger than that of the spherical shape. Accordingly, the C phase and the oxide phase in the target is likely to be favorably bonded to the FePt-based alloy, which is the matrix metal.

Therefore, the number of particles generated during sputtering using the FePt—C-based sputtering target according to the second embodiment is reduced. This has been demonstrated as shown in Examples described later.

Since the oxide phase is finely dispersed in the FePt-based alloy phase to have a size of about 1 μm or smaller, it scarcely becomes a cause of generating particles.

As for the relative density of the target, the larger the value of the relative density, the smaller the amount of voids in the target. Therefore, the larger value of the relative density is preferable in terms of performing sputtering favorably. Specifically, the relative density of the target is preferably 90% or larger and more preferably 95% or larger.

From the viewpoint that the periphery of the C phase is more easily covered with the FePt-based alloy, which is the matrix metal, the average value of the size indices a of the C phase is preferably 5.0 μm or more and 8.0 μm or less. From the viewpoint of increasing the surface area per unit volume of the C phase, the average value of the nonspherical indices b of the C phase is preferably 5.0 or more.

2-1-4. Element Other than Fe and Pt

The FePt—C-based sputtering target according to the second embodiment contains only Fe and Pt as metal elements. However, the FePt-based alloy phase may contain an element other than Fe and Pt (modification of the second embodiment).

The details of the element other than Fe and Pt that are to be contained in the FePt-based alloy phase in the FePt—C-based sputtering target according to the second embodiment are the same as the details described in "1-1-4. Element other than Fe and Pt" in the first embodiment, and the description thereof will be omitted here.

2-2. Manufacturing Method

The FePt—C-based sputtering target according to the second embodiment can be manufactured by: mixing a C powder containing C particles, of which an average particle diameter is 8 μm or more and 60 μm or less and of which shape is nonspherical, and an oxide powder, to an FePt-based alloy powder having an average particle diameter of 60 μm or less and containing 33 mol % or more and 60 mol % or less of Pt with the balance substantially being Fe to thereby produce a powder mixture for pressure sintering; and then molding the produced powder mixture for pressure sintering while the powder mixture is heated under application of pressure.

If the average particle diameter of the FePt-based alloy powder exceeds 60 μm, the relative density of the resulting target may not be sufficiently increased, so that the periphery of the C particles may not be sufficiently covered with the FePt-based alloy. Thus the number of particles generated when sputtering is performed using the resulting sputtering target may increase. From the viewpoint of sufficiently increasing the relative density of the resulting target, so as to sufficiently cover the periphery of the C particles with the FePt-based alloy, the average particle diameter of the FePt-based alloy powder to be used in the manufacture of the FePt—C-based sputtering target according to the second embodiment is preferably 55 μm or less, and more preferably 50 μm or less.

The C powder used contains C particles of which an average particle diameter is 8 μm or more and 60 μm or less and of which shape is nonspherical. An oxide powder having, for example, an average particle diameter of 0.01 to 20 μm may be used. When the C powder containing such C powder and an oxide powder are used, the C phase in the resulting target has an appropriate size and shape. As demonstrated in Examples described later, the number of particles generated during sputtering is reduced. From the viewpoint of allowing the C phase to have an appropriate size and shape in the resulting target to reduce the number of particles generated during sputtering, the average particle diameter of the C powder to be used in the manufacture of the FePt—C-based sputtering target according to the second embodiment is more preferably 10 μm or more and 55 μm or less, and particularly preferably 12 μm or more and 52 μm or less. The same is applied to the other examples of the manufacturing method to be described later.

No particular limitation is imposed on the atmosphere when the FePt-based alloy powder, the C powder, and the oxide powder are mixed to produce the powder mixture for pressure sintering, and the FePt-based alloy powder, the C powder, and the oxide powder may be mixed in air.

When the atmosphere contains oxygen during the production of the powder mixture for pressure sintering, it can prevent the oxide powder from being reduced during mixing and thus can prevent incorporation of metal originated from the oxide powder into the FePt-based alloy powder during mixing. Therefore, an FePtC based thin film produced by using the obtained FePt—C-based sputtering target is likely to exhibit stable magnetic recording characteristics.

Instead of the FePt-based alloy powder, a single Fe powder with an average particle diameter of 20 μm or less and a single Pt powder with an average particle diameter of 5 μm or less may be used. In this case, the single Fe powder and the single Pt powder are weighed such that the ratio of the amount of Pt to the total amount of Fe and Pt is 33 mol % or more and 60 mol % or less. Then the weighed single Fe powder, the weighed single Pt powder, and a C powder containing C particles, of which an average particle diameter is 8 μm or more and 60 μm or less and of which shape is nonspherical, and an oxide powder are mixed to thereby produce a powder mixture for pressure sintering. Then the produced powder mixture for pressure sintering is molded while the powder mixture is heated under application of pressure.

From the viewpoint of sufficiently increasing the relative density of the resulting target, so as to sufficiently cover the periphery of the C particles with Fe and Pt, the average particle diameter of the single Fe powder to be used in the manufacture of the FePt—C-based sputtering target according to the second embodiment is preferably 15 μm or less, and more preferably 10 μm or less. From the similar viewpoint, the average particle diameter of the single Pt powder to be used in the manufacture of the FePt—C-based sputtering target according to the second embodiment is preferably 4 μm or less, and more preferably 3 μm or less.

However, since the activity of the single Fe powder is high, it may ignite in air and therefore must be handled with sufficient care. By alloying Fe and Pt to form an FePt-based alloy powder, the activity of the Fe can be lowered even though it is in powder form. The use of the FePt-based alloy powder is more preferred from this point of view.

In the second embodiment, the oxide may contain, for example, at least one of $SiO_2$, $TiO_2$, $Ti_2O_3$, $Ta_2O_5$, $Cr_2O_3$, CoO, $Co_3O_4$, $B_2O_3$, $Fe_2O_3$, $Fe_3O_4$, CuO, $Cu_2O$, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

No particular limitation is imposed on the method for molding the powder mixture for pressure sintering produced as described above while the powder mixture is heated under application of pressure. For example, a hot pressing method, a hot isostatic pressing method (HIP method), a spark plasma sintering method (SPS method), etc. may be used. Preferably, when implementing the present invention, such a molding method is performed in a vacuum or an inert gas atmosphere. In this case, even when the powder mixture contains a certain amount of oxygen, the amount of oxygen in the obtained sintered product decreases.

When the FePt-based alloy phase contains an element other than Fe and Pt as in the modification of the second embodiment, an FePt-based alloy powder having an average particle diameter of 60 μm or less and containing 33 mol % or more and less than 60 mol % of Pt and more than 0 mol % and 20 mol % or less of at least one metal element other than Fe and Pt with the balance substantially being Fe and with the total amount of Pt and the at least one element being 60 mol % or less may be used instead of the FePt-based alloy powder, having an average particle diameter of 60 μm or less, and containing 33 mol % or more and 60 mol % or less of Pt with the balance substantially being Fe. The subsequent steps are the same as those when the FePt-based alloy phase does not contain an element other than Fe and Pt (as in the second embodiment).

Also in manufacturing the target of modification of the second embodiment, from the viewpoint of sufficiently increasing the relative density of the resulting target, so as to sufficiently cover the periphery of the C particles with the FePt-based alloy, the average particle diameter of the FePt-based alloy powder to be used is preferably 55 μm or less, and more preferably 50 μm or less.

In manufacturing the target of modification of the second embodiment, an FePt-based alloy powder having an average particle diameter of 60 μm or less and containing Pt with the balance substantially being Fe, and a powder containing at least one element other than Fe and Pt with the balance being unavoidable impurities and having an average particle diameter of 30 μm or less may be used.

In this case, an FePt-based alloy powder having an average particle diameter of 60 μm or less and containing Pt with the balance substantially being Fe, and a powder containing at least one element other than Fe and Pt with the balance being unavoidable impurities and having an average particle diameter of 30 μm or less are weighed such that the ratio of the amount of the Pt with respect to the total amounts of the Pt, the Fe, and the at least one metal element is 33 mol % or more and less than 60 mol %, the ratio of the amount of the at least one metal element with respect to the total amount is more than 0 mol % and 20 mol % or less, and the ratio of the sum of the amounts of the Pt and the at least one metal element with respect to the total amount is 60 mol % or less. Then the weighed FePt-based alloy powder, the weighed powder containing at least one metal element, a C powder containing C particles, of which an average particle diameter is 8 μm or more and 60 μm or less and of which shape is nonspherical, and an oxide powder are mixed to thereby produce a powder mixture for pressure sintering. Then the produced powder mixture for pressure sintering is molded while the powder mixture is heated under application of pressure.

Also in this case, from the viewpoint of sufficiently increasing the relative density of the resulting target, so as to sufficiently cover the periphery of the C particles with the FePt-based alloy and the powder containing at least one element other than Fe and Pt, the average particle diameter of the FePt-based alloy powder to be used is preferably 55 μm or less, and more preferably 50 μm or less, and the average particle diameter of the powder containing at least one element other than Fe and Pt is preferably 25 μm or less, and more preferably 20 μm or less.

In manufacturing the target of modification of the second embodiment, a single Pt powder containing unavoidable impurities and having an average particle diameter of 5 μm or less, a single Fe powder containing unavoidable impurities and having an average particle diameter of 20 μm or less, and a powder containing at least one element other than Fe and Pt with the balance being unavoidable impurities and having an average particle diameter of 30 μm or less may be used.

In this case, the single Pt powder having an average particle diameter of 5 μm or less, the single Fe powder having an average particle diameter of 20 μm or less, and the powder containing at least one element other than Fe and Pt and having an average particle diameter of 30 μm or less are weighed such that the ratio of the amount of the Pt with respect to the total amounts of the Pt, the Fe, and the at least one element is 33 mol % or more and less than 60 mol %, the ratio of the amount of the at least one element with respect to the total amount is more than 0 mol % and 20 mol % or less, and the ratio of the sum of the amounts of the Pt and the at least one element with respect to the total amount is 60 mol % or less. Then the weighed single Pt powder, the weighed single Fe powder, the weighed powder containing at least one metal element, a C powder containing C particles, of which an average particle diameter is 8 μm or more and 60 μm or less and of which shape is nonspherical, and an oxide powder are mixed to thereby produce a powder mixture for pressure sintering. Then the produced powder mixture for pressure sintering is molded while the powder mixture is heated under application of pressure.

Also in this case, from the viewpoint of sufficiently increasing the relative density of the resulting target, so as to sufficiently cover the periphery of the C particles with the single Pt powder, the single Fe powder and the powder containing at least one element other than Fe and Pt, the average particle diameter of the single Pt powder to be used is preferably 4 μm or less, and more preferably 3 μm or less, the average particle diameter of the single Fe powder to be used is preferably 15 μm or less, and more preferably 10 μm or less, and the average particle diameter of the powder containing at least one element other than Fe and Pt is preferably 25 μm or less, and more preferably 20 μm or less.

2-3. Effects

The FePt—C-based sputtering target according to the second embodiment has a structure in which a C phase substantially being C and an oxide phase substantially being oxide are dispersed in an FePt-based alloy phase containing 33 mol % or more and 60 mol % or less of Pt with the balance substantially being Fe. When in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

In the FePt—C-based sputtering target according to the second embodiment, the average value of the size indices a of the C phase is 4.0 μm or more and 9.0 μm or less, and the C phase has an appropriate size that facilitates covering of the periphery of the C phase with the FePt-based alloy that is a matrix metal. Since the average value of the nonspherical indices b of the C phase is 3.0 or more, the C phase in the target has a long, thin shape as compared to a spherical shape. Thus, the surface area per unit volume of the C phase is larger than that of the spherical shape. Accordingly, the C phase in the target is likely to be favorably bonded to the FePt-based alloy, which is the matrix metal.

Therefore, the number of particles generated during sputtering using the FePt—C-based sputtering target according to the second embodiment is reduced. This has been demonstrated as shown in Examples described later.

In the manufacturing method according to the second embodiment, since a sintering process is used instead of a casting process, the content of the sum of C and oxide relative to the total amount of the target can be increased, so that an FePt—C-based sputtering target in which a content percentage of the sum of C and oxide relative to the entire target is 10 mol % or more and 60 mol % or less can be produced. Therefore, by performing sputtering using the FePt—C-based sputtering target according to the second embodiment, a thin film containing an FePt-based alloy and much carbon and oxide as to be capable of being used as a magnetic recording medium can be formed using only the above target alone, i.e., without using a plurality of targets.

EXAMPLES

Example 1

The targeted composition of a powder mixture, a sintered body and a target in Example 1 is 60.5(50Fe-50Pt)-39.5C. Specifically, the targeted composition of the metal components is 50 mol % Fe-50 mol % Pt, and the targeted composition ratio of the FePt alloy to C (carbon) is 60.5 mol % of the FePt alloy and 39.5 mol % of C.

451.73 g of a Pt powder having an average particle diameter of 1.17 μm and 36.31 g of a nonspherical C powder having an average particle diameter of 12.17 μm were added to 129.32 g of the Fe powder having an average particle diameter of 6.75 μm. Then, they were mixed in the mixer using balls at 300 rpm for 30 minutes to thereby obtain a powder mixture for pressure sintering.

The obtained powder mixture for pressure sintering was subjected to hot pressing under the conditions of sintering temperature: 1150° C., pressure: 30.6 MPa, time: 60 min, and atmosphere: $5 \times 10^{-2}$ Pa or lower to prepare a sintered body.

The density of the produced sintered body was measured by the Archimedes method, and the measured value was divided by the theoretical density to determine a relative density. The relative density was 95.82%.

The content of carbon in the produced sintered body was measured with a carbon/sulfur analyzer manufactured by HORIBA, Ltd. The contents of oxygen and nitrogen in the sintered body were measured with a TC-600 Series oxygen/nitrogen determinator manufactured by LECO Corporation. The contents of carbon, oxygen, and nitrogen in the sintered body were 5.98 mass %, 298 mass ppm, and 8 mass ppm, respectively.

When the powder mixture for pressure sintering is subjected to pressure sintering to produce a target, part of the C (carbon) reacts with oxygen, so that the composition ratio of the FePt alloy to the C (carbon) in the target obtained slightly deviates from the targeted value. Therefore, the relative density of the resulting sintered body was computed in consideration of the change in the amount of C (carbon) (on the basis of the content of carbon measured by the carbon/sulfur analyzer manufactured by HORIBA, Ltd.) in this Example 1. The aforementioned relative density of 95.82% was also computed in the same manner. Also in other Examples and Comparative Examples in the present specification, the relative density was computed in consideration of the change in the amount of C (carbon) (on the basis of the content of carbon measured by the carbon/sulfur analyzer manufactured by HORIBA, Ltd.).

The structure of the obtained sintered body of Example 1 was observed under a scanning electron microscope (SEM). Specifically, images at 10 locations in a cross section of the sintered body of Example 1 in its thickness direction (cross section of the sintered body in a direction in which a pressure was applied thereto during hot pressing) were taken with the scanning electron microscope (SEM) to obtain 10 SEM photographs. The 10 SEM photographs are SEM photographs showing the field of view with a size of 121 μm×97 μm taken with 1,000× magnification. FIG. 1 shows one of the 10 SEM photographs taken. The scale in the photograph shown in FIG. 1 is 10 μm.

In FIG. 1, gray phase is the FePt alloy phase and black phase is C (carbon) phase.

Figure 2:
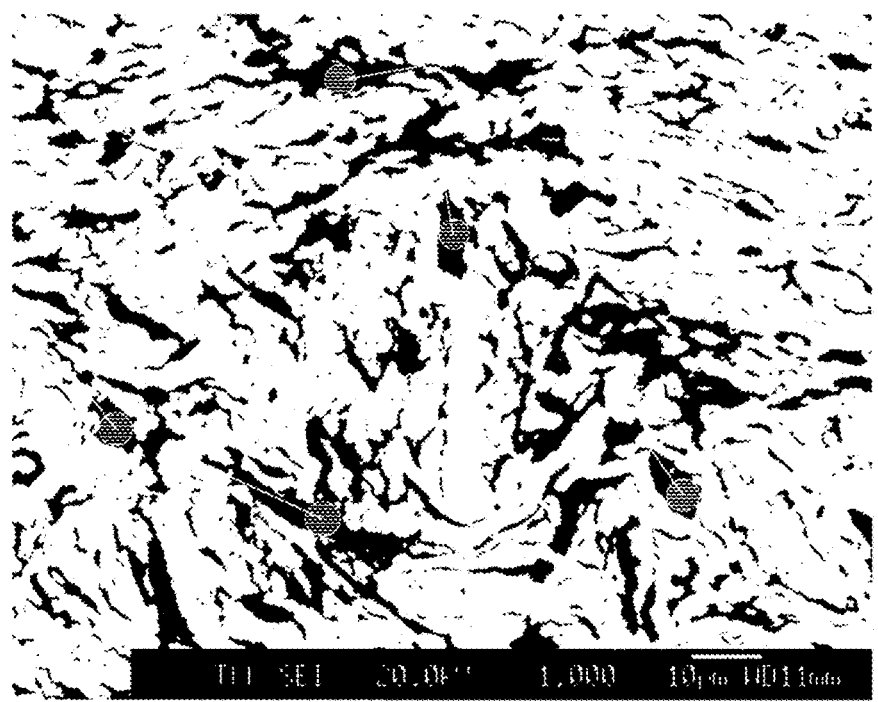
FIG. 2 is an image obtained by subjecting the SEM photograph of FIG. 1 to a binarization process.

In order to facilitate the evaluation of the size and shape of the C (carbon) phase, 10 SEM photographs taken were each subjected to a binarization process to obtain 10 binarized images. FIG. 2 is an image after the SEM photograph shown in FIG. 1 was subjected to a binarization process. In the image, the white phase corresponds to the FePt alloy phase while the black phase corresponds to the C (carbon) phase.

The size and shape of the C (carbon) phase were evaluated using 10 binarized images taken at 10 locations in the cross section of the sintered body. A description will be given of the evaluation procedures (1) to (6) as follows.

(1) First, images at 10 locations in a cross section of the obtained sintered body in its thickness direction (cross section of the sintered body in a direction in which a pressure was applied thereto during hot pressing) are taken with the scanning electron microscope (SEM) to obtain 10 scanning electron microscope images (10 SEM photographs). These 10 SEM photographs are SEM photographs showing the field of view with a size of 121 μm×97 μm taken with 1,000× magnification.

(2) The obtained 10 SEM photographs are subjected to a binarization process to obtain 10 binarized images that facilitate the determination of interface of the C phase. More specifically, the binarization process is performed using an image processing software ImageJ 1.44o. The binarization is performed by the command "Make Binary" with the binarization condition (Threshold) set to "Default." At that time, noise bright points in the C phase are removed (Remove Outliers (Radius: 3.0 pixels, Threshold: 50)). These processing can provide 10 binarized images.

(3) Five "inscribed circles of the C phase" from the largest diameter in each of the 10 binarized images are selected, where the "inscribed circle" does not include the FePt alloy phase thereinside but includes only the C (carbon) phase thereinside and is inscribed at the interface of the C (carbon) phase. Then, the average value of the diameters of the five inscribed circles selected in each of the 10 binarized images is obtained and regarded as the size index a of the C phase. FIG. 2 shows an example where five inscribed circles from the largest diameter that is inscribed at the interface of the C (carbon) phase are described in the binarized image, with the inscribed circles hatched. FIG. 3 shows a binarized image with an area including one inscribed circle described in FIG. 2 in an enlarged manner.

The "inscribed circle of the C phase" used herein will now be defined. FIG. 4 is a diagram illustrating the definition of the "inscribed circle of the C phase" used herein. The "inscribed circle of the C phase" used herein refers to an inscribed circle that is circumscribed at the interface in the binarized image. Here, a plurality of inscribed circles may be drawn in one C phase. In this case, it is necessary to draw these inscribed circles in the one C phase so that they are not in contact with one another or they are circumscribed to one another (see FIG. 4A). They cannot be drawn so that they are inscribed in one another (see FIG. 4B), so that they cross one another (see FIG. 4C), and so that one encompasses another (see FIG. 4D).

(4) A maximum length L of a straight line among straight lines connecting the center of each of five inscribed circles of the C phase from the largest diameter to the fifth largest diameter to the interface of the C phase is obtained in each of the 10 binarized images. FIG. 2 shows an example describing the straight line having the maximum length L stretching from the center of each inscribed circle to the interface of the C (carbon) phase.

(5) The maximum length L is divided by the radius R of the inscribed circle to obtain the value of L/R for each of the C phases from the largest diameter to the fifth largest diameter of the inscribed circle. Then, the average value of the five values L/R obtained is regarded as a nonspherical index b of the C phase.

(6) The size indices a of the C phase obtained in the aforementioned (3) for each of the 10 binarized images are averaged to obtain an average value. The nonspherical indices b of the C phase obtained in the aforementioned (5) for each of the 10 binarized images are averaged to obtain an average value.

As to the sintered body of Example 1, the average value of the size indices a of the C phase obtained by the procedures (1) to (6) was 5.3 µm. The average value of the nonspherical indices b of the C phase obtained by the procedures (1) to (6) was 4.5.

Next, the obtained sintered body was used to produce a sputtering target having a diameter of 153 mm and a thickness of 2 mm, and the sputtering target was joined to a Cu backing plate having a diameter of 161 mm and a thickness of 4 mm. The sputtering target after joining was set in a sputtering apparatus. Then sputtering was performed at an output of 500 W and an Ar gas pressure in a chamber of 1 Pa, and the number of particles generated was evaluated. Specifically, the sputtering was interrupted at cumulative sputtering times of 15 minutes, 30 minutes, 1 hour, and 2 hours. A circular glass substrate having a diameter of 2.5 inches was set in the sputtering apparatus at each time point, and sputtering was performed for 20 seconds. The cumulative sputtering time is the cumulative time during which the sputtering was performed.

The circular glass substrate with a diameter of 2.5 inches having been subjected to sputtering for 20 seconds at each time point was removed from the sputtering apparatus and set in an optical surface analyzer to count the number of particles generated. The number of particles counted before sputtering at each time point was subtracted from the number of particles after the sputtering at this time point. Then, the obtained number was divided by 10, and the resultant was regarded as the number of particles generated at this time point. That is, the number of particles generated by performing sputtering for 20 seconds was divided by 10, and the resultant was regarded as the number of particles generated at this time point. This condition was set in conformity with about 2 seconds which is the sputtering time when a magnetic phase of a hard disk is formed.

Figure 5:
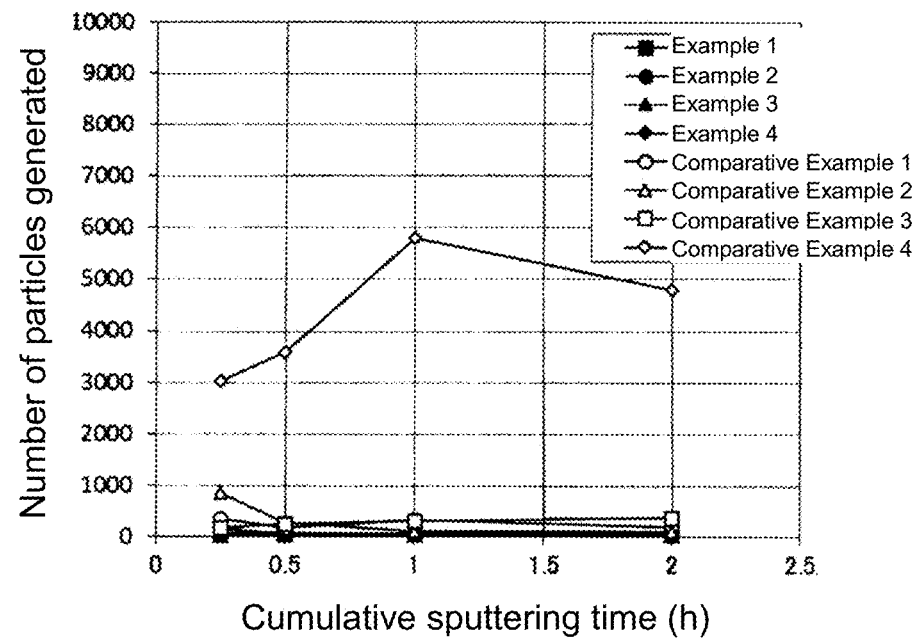
FIG. 5 is a graph showing the relation between cumulative sputtering time and the number of particles generated for each of sputtering targets in Examples 1 to 4 and Comparative Examples 1 to 4.
Figure 6:
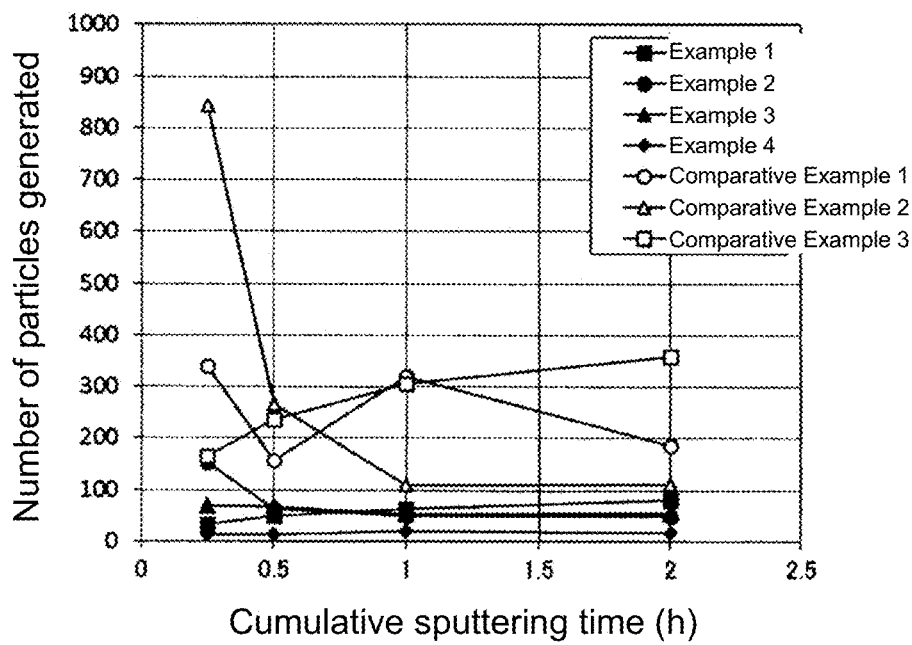
FIG. 6 is a graph showing the relation between cumulative sputtering time and the number of particles generated for each of sputtering targets in Examples 1 to 4 and Comparative Examples 1 to 3.

The numbers of particles generated at the cumulative sputtering times of 15 minutes, 30 minutes, 1 hour, and 2 hours were 33, 49, 62, and 80, respectively. FIGS. 5 and 6 are graphs showing a plot of these values, together with the results in other Examples and Comparative Examples. The horizontal axis in each of FIGS. 5 and 6 represents the cumulative sputtering time (h), and the vertical axis represents the number of particles generated (particles). The scales on the vertical axes in FIGS. 5 and 6 are different from each other. The scale on the vertical axis in FIG. 5 is large, and the scale on the vertical axis in FIG. 6 is small.

The cross section in the thickness direction of the sintered body (cross section of the sintered body in a direction in which a pressure was applied thereto during hot pressing) refers to a cross section in the thickness direction of the sputtering target in terms of the sputtering target. The same is applied to Examples 2 to 4 and Comparative Examples 1 to 3 to be described later.

Example 2

In Example 2, a sintered body and a sputtering target were produced in the same manner as in Example 1 except that 36.31 g of a nonspherical C powder having an average particle diameter of 19.93 µm was used instead of 36.31 g of the nonspherical C powder having an average particle diameter of 12.17 µm used in Example 1. The targeted composition of the sintered body and sputtering target is 60.5 (50Fe-50Pt)-39.5C which is the same as that in Example 1.

The relative density of the produced sintered body was measured in the same manner as in Example 1 and was found to be 95.20%.

The contents of carbon, oxygen, and nitrogen in the produced sintered body were measured in the same manner as that in Example 1, and found to be 6.01 mass %, 199 mass ppm, and 14 mass ppm, respectively.

In the sintered body of Example 2, the average value of the size indices a of the C phase as determined in the same manner as that in Example 1 was 6.3 µm. The average value of the nonspherical indices b of the C phase as determined in the same manner as that in Example 1 was 5.2.

In Example 2, as in Example 1, the sputtering target was produced using the obtained sintered body and used to perform sputtering, and the number of particles generated was evaluated. The numbers of particles generated at the cumulative sputtering times of 15 minutes, 30 minutes, 1 hour, and 2 hours were 152, 62, 48, and 48, respectively. FIGS. 5 and 6 are graphs showing a plot of these values, together with the results in other Examples and Comparative Examples.

Example 3

In Example 3, a sintered body and a sputtering target were produced in the same manner as in Example 1 except that 36.31 g of a nonspherical C powder having an average particle diameter of 51.01 µm was used instead of 36.31 g of the nonspherical C powder having an average particle diameter of 12.17 µm used in Example 1. The targeted composition of the sintered body and sputtering target is 60.5 (50Fe-50Pt)-39.5C which is the same as that in Example 1.

The relative density of the produced sintered body was measured in the same manner as in Example 1 and was found to be 96.54%.

The contents of carbon, oxygen, and nitrogen in the produced sintered body were measured in the same manner as that in Example 1, and found to be 5.99 mass %, 264 mass ppm, and 10 mass ppm, respectively.

In the sintered body of Example 3, the average value of the size indices a of the C phase as determined in the same manner as that in Example 1 was 7.6 µm. The average value of the nonspherical indices b of the C phase as determined in the same manner as that in Example 1 was 6.0.

In Example 3, as in Example 1, the sputtering target was produced using the obtained sintered body and used to perform sputtering, and the number of particles generated was evaluated. The numbers of particles generated at the cumulative sputtering times of 15 minutes, 30 minutes, 1 hour, and 2 hours were 68, 67, 52, and 55, respectively. FIGS. 5 and 6 are graphs showing a plot of these values, together with the results in other Examples and Comparative Examples.

Example 4

The targeted composition of a powder mixture, a sintered body and a target in Example 4 is 60(50Fe-50Pt)-30C-10SiO$_2$. Specifically, the targeted composition of the metal components is 50 mol % Fe-50 mol % Pt, and the targeted composition ratio of the FePt alloy, C (carbon), and SiO$_2$ are 60 mol % of FePt alloy, 30 mol % of C, and 10 mol % of SiO$_2$.

The C powder used in Example 4 is the same C powder as that used in Example 2, and a nonspherical C powder having an average particle diameter of 19.93 µm. 17.46 Grams of that C powder was used in Example 4.

In Example 4, an SiO$_2$ powder having an average particle diameter of 0.7 µm was also used.

Before producing the sintered body and sputtering target according to Example 4, an FePt alloy powder was first produced using a gas atomizing method.

To 740.00 g of the produced FePt alloy powder, 59.07 g of the SiO$_2$ powder was added, and they were mixed for 57 hours with a mixer using balls at 462 rpm, to thereby obtain a first mixed powder.

To 394.00 g of the obtained first mixed powder, 17.46 g of C powder was added, and they were mixed for 30 minutes with a mixer using balls at 300 rpm, to thereby obtain a powder mixture for pressure sintering.

The obtained powder mixture for pressure sintering was subjected to hot pressing under the conditions of sintering temperature: 1100° C., pressure: 30.6 MPa, time: 60 min, and atmosphere: $5 \times 10^{-2}$ Pa or lower to prepare a sintered body.

The relative density of the produced sintered body was measured in the same manner as in Example 1 and was found to be 94.37%.

The contents of carbon, oxygen, and nitrogen in the produced sintered body were measured in the same manner as that in Example 1, and found to be 3.88 mass %, 3.68 mass %, and 8 mass ppm, respectively.

In the sintered body of Example 4, the average value of the size indices a of the C phase was 5.4 µm. The average value of the nonspherical indices b of the C phase was 5.6.

In Example 4, as in Example 1, the sputtering target was produced using the obtained sintered body and used to perform sputtering, and the number of particles generated was evaluated. The numbers of particles generated at the cumulative sputtering times of 15 minutes, 30 minutes, 1 hour, and 2 hours were 13, 13, 18, and 17, respectively. FIGS. 5 and 6 are graphs showing a plot of these values, together with the results in other Examples and Comparative Examples.

Comparative Example 1

In Comparative Example 1, a sintered body and a sputtering target were produced in the same manner as in Example 1 except that 36.31 g of a spherical C powder having an average particle diameter of 6.63 µm was used instead of 36.31 g of the nonspherical C powder having an average particle diameter of 12.17 µm used in Example 1 and that the obtained powder mixture for pressure sintering was subjected to hot pressing at 1100° C. The targeted composition of the sintered body and sputtering target is 60.5(50Fe-50Pt)-39.5C which is the same as that in Example 1.

The relative density of the produced sintered body was measured in the same manner as in Example 1 and was found to be 96.07%.

The content of carbon in the produced sintered body was measured with a carbon/sulfur analyzer manufactured by HORIBA, Ltd. The contents of oxygen and nitrogen in the sintered body were measured with a TC-600 Series oxygen/nitrogen determinator manufactured by LECO Corporation. The contents of carbon, oxygen, and nitrogen in the sintered body were 6.07 mass %, 377 mass ppm, and 14 mass ppm, respectively.

Figure 7:
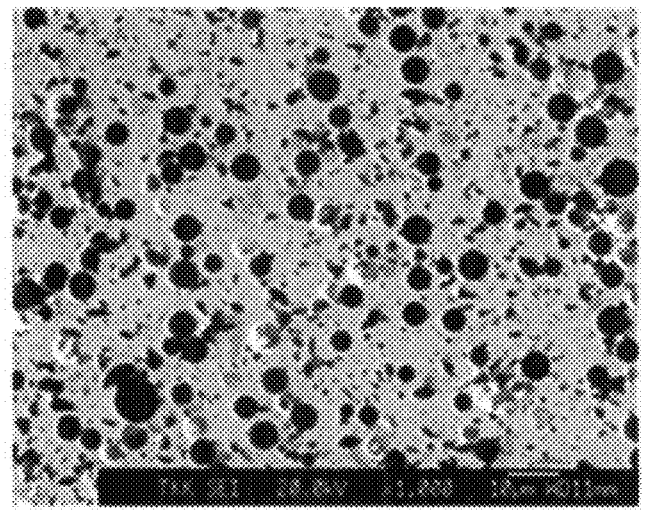
FIG. 7 is a SEM photograph (a SEM photograph in which a field of view of 121 μm×97 μm was taken with 1,000× magnification, and the scale in this photograph is 10 μm) showing a cross section in a thickness direction of a sintered body of Comparative Example 1 (a cross section of the sintered body in a direction in which a pressure was applied during hot pressing).

The structure of the obtained sintered body of Comparative Example 1 was observed under a scanning electron microscope (SEM). Specifically, images at 10 locations in a cross section of the sintered body of Comparative Example 1 in its thickness direction (cross section of the sintered body in a direction in which a pressure was applied thereto during hot pressing) were taken with the scanning electron microscope (SEM) to obtain 10 SEM photographs. The 10 SEM photographs are SEM photographs showing the field of view with a size of 121 µm×97 µm taken with 1,000× magnification. FIG. 7 shows one of the 10 SEM photographs taken. The scale in the photograph shown in FIG. 7 is 10 µm.

In FIG. 7, gray phase is the FePt alloy phase and black phase is C (carbon) phase.

Figure 8:
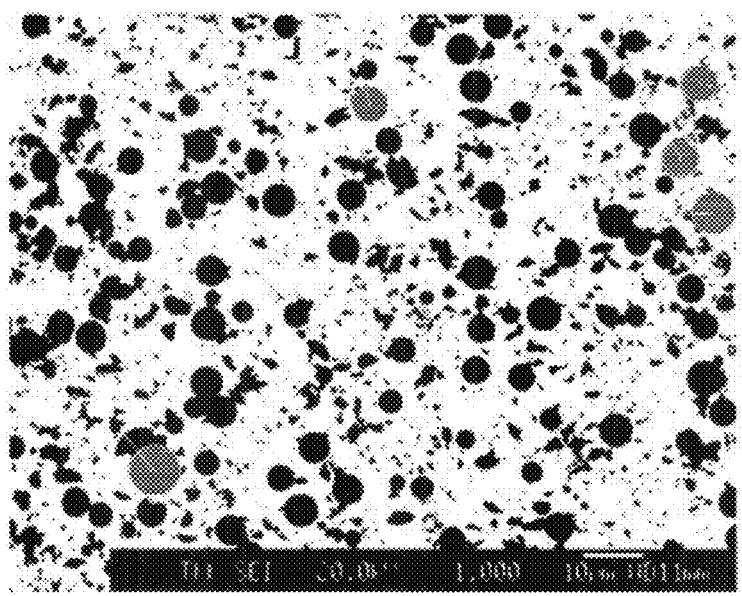
FIG. 8 is an image obtained by subjecting the SEM photograph of FIG. 7 to a binarization process.
Figure 9:
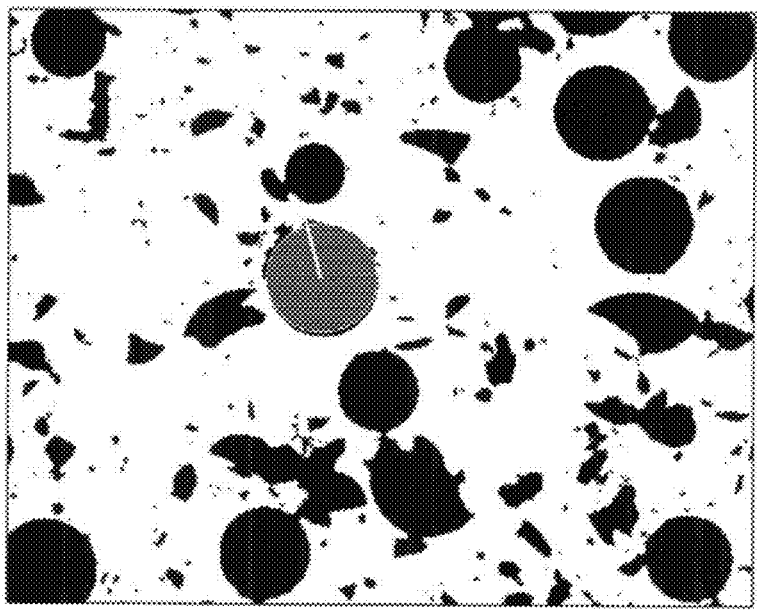
FIG. 9 is a binarized image showing an enlarged area including one inscribed circle described in FIG. 8.

In order to facilitate the evaluation of the size and shape of the C (carbon) phase, 10 SEM photographs taken were each subjected to a binarization process to obtain 10 binarized images. FIG. 8 is an image after the SEM photograph shown in FIG. 7 was subjected to a binarization process. In the image, the white phase corresponds to the FePt alloy phase while the black phase corresponds to the C (carbon) phase. FIG. 8 shows an example where five inscribed circles from the largest diameter that are inscribed at the interface of the C (carbon) phase are described with the inscribed circles hatched. FIG. 9 shows a binarized image with an area including one inscribed circle described in FIG. 8 in an enlarged manner.

In the sintered body of Comparative Example 1, the average value of the size indices a of the C phase as determined in the same manner as that in Example 1 was 6.6 µm. The average value of the nonspherical indices b of the C phase as determined in the same manner as that in Example 1 was 2.0.

In Comparative Example 1, as in Example 1, the sputtering target was produced using the obtained sintered body and used to perform sputtering, and the number of particles generated was evaluated. The numbers of particles generated at the cumulative sputtering times of 15 minutes, 30 minutes, 1 hour, and 2 hours were 340, 156, 320, and 186, respectively. FIGS. 5 and 6 are graphs showing a plot of these values, together with the results in other Examples and Comparative Examples.

Comparative Example 2

In Comparative Example 2, a sintered body and a sputtering target were produced in the same manner as in Example 1 except that 36.31 g of a spherical C powder having an average particle diameter of 22.55 µm was used instead of 36.31 g of the nonspherical C powder having an average particle diameter of 12.17 µm used in Example 1 and that the obtained powder mixture for pressure sintering was subjected to hot pressing at 1050° C. The targeted composition of the sintered body and sputtering target is 60.5(50Fe-50Pt)-39.5C which is the same as that in Example 1.

The relative density of the produced sintered body was measured in the same manner as in Example 1 and was found to be 97.11%.

The contents of carbon, oxygen, and nitrogen in the produced sintered body were measured in the same manner as that in Example 1, and found to be 5.90 mass %, 264 mass ppm, and 28 mass ppm, respectively.

In the sintered body of Comparative Example 2, the average value of the size indices a of the C phase as determined in the same manner as that in Example 1 was 9.7 µm. The average value of the nonspherical indices b of the C phase as determined in the same manner as that in Example 1 was 2.5.

In Comparative Example 2, as in Example 1, the sputtering target was produced using the obtained sintered body and used to perform sputtering, and the number of particles generated was evaluated. The numbers of particles generated at the cumulative sputtering times of 15 minutes, 30 minutes, 1 hour, and 2 hours were 842, 265, 108, and 110, respectively. FIGS. 5 and 6 are graphs showing a plot of these values, together with the results in other Examples and Comparative Examples.

Comparative Example 3

In Comparative Example 3, a sintered body and a sputtering target were produced in the same manner as in Example 1 except that 36.31 g of a nonspherical C powder having an average particle diameter of 5.09 µm was used instead of 36.31 g of the nonspherical C powder having an average particle diameter of 12.17 µm used in Example 1 and that the obtained powder mixture for pressure sintering was subjected to hot pressing at 1300° C. The targeted composition of the sintered body and sputtering target is 60.5(50Fe-50Pt)-39.5C which is the same as that in Example 1.

The relative density of the produced sintered body was measured in the same manner as in Example 1 and was found to be 94.37%.

The contents of carbon, oxygen, and nitrogen in the produced sintered body were measured in the same manner as that in Example 1, and found to be 5.91 mass %, 211 mass ppm, and 18 mass ppm, respectively.

In the sintered body of Comparative Example 3, the average value of the size indices a of the C phase as determined in the same manner as that in Example 1 was 3.7 µm. The average value of the nonspherical indices b of the C phase as determined in the same manner as that in Example 1 was 3.9.

In Comparative Example 3, as in Example 1, the sputtering target was produced using the obtained sintered body and used to perform sputtering, and the number of particles generated was evaluated. The numbers of particles generated at the cumulative sputtering times of 15 minutes, 30 minutes, 1 hour, and 2 hours were 165, 236, 305, and 360, respectively. FIGS. 5 and 6 are graphs showing a plot of these values, together with the results in other Examples and Comparative Examples.

Comparative Example 4

In Comparative Example 4, the targeted composition of the sintered body and sputtering target is 60.5(50Fe-50Pt)-39.5C which is the same as that in Example 1.

The C powder used in Comparative Example 4 is carbon black having an average primary particle diameter (median diameter) of 30 nm (catalogue value) and forming secondary particles. Each shape of the individual C particles is nonspherical. In Comparative Example 4, 62.50 g of the C powder was used.

Before producing the sintered body and sputtering target according to Comparative Example 4, an FePt alloy powder was first produced using a gas atomizing method. The average particle diameter of the obtained FePt alloy powder was 45 µm.

To 1000.00 g of the produced FePt alloy powder, 62.50 g of the C powder was added, and they were mixed for 24 hours with a mixer using balls at 462 rpm, to thereby obtain a powder mixture for pressure sintering.

The obtained powder mixture for pressure sintering was subjected to hot pressing under the conditions of sintering temperature: 1460° C., pressure: 26.2 MPa, time: 60 min, and atmosphere: $5 \times 10^{-2}$ Pa or lower to prepare a sintered body.

The relative density of the produced sintered body was measured in the same manner as in Example 1 and was found to be 96.12%.

The contents of carbon, oxygen, and nitrogen in the produced sintered body were measured in the same manner as that in Example 1, and found to be 5.72 mass %, 23 mass ppm, and 10 mass ppm, respectively.

In the sintered body of Comparative Example 4, the average value of the size indices a of the C phase as determined in the same manner as that in Example 1 was 0.8 µm. The average value of the nonspherical indices b of the C phase as determined in the same manner as that in Example 1 was 3.5.

In Comparative Example 4, as in Example 1, the sputtering target was produced using the obtained sintered body and used to perform sputtering, and the number of particles generated was evaluated. The numbers of particles generated at the cumulative sputtering times of 15 minutes, 30 minutes, 1 hour, and 2 hours were 3019, 3587, 5803, and 4807, respectively. FIGS. 5 and 6 are graphs showing a plot of these values, together with the results in other Examples and Comparative Examples.

As shown in FIGS. 5 and 6, the number of particles generated when the sputtering target according to Comparative Example 4 was used to perform sputtering was much larger than those in Examples 1 to 4 and Comparative Examples 1 to 3. In Comparative Example 4, the C powder used was carbon black having a very small average primary particle diameter (median diameter) of 20 to 50 nm (catalogue value 30 nm) and forming secondary particles. Therefore, it is considered that the carbon black formed secondary particles also in the FePt alloy phase. The C in the form of secondary particles is formed as compressed clusters of primary particles of C, and primary particles of C present inside the secondary particles are not covered with the FePt alloy. Therefore, it is considered that the primary particles of C present inside the secondary particles may easily fall off the target as clusters during sputtering to thereby facilitate the formation of particles. This may be the reason that the number of particles generated when the sputtering target of Comparative Example 4 was used to perform sputtering was much larger than those in Examples 1 to 4 and Comparative Examples 1 to 3.

Discussion

The principal data in Examples 1 to 4 and Comparative Examples 1 to 4 is summarized in TABLE 1 below. The composition of the target in Examples 1 to 3 and Comparative Examples 1 to 4 is 60.5(50Fe-50Pt)-39.5C while the composition only in Example 4 is 60 (50Fe-50Pt)-30C-10SiO$_2$.

and thus, the size of the C phase is too small. Accordingly, it is considered that the periphery of the C phase is not sufficiently covered with the FePt-based alloy, which is the matrix metal, and the number of the particles generated is increased compared to Examples 1 to 4.

In Comparative Example 4, as described above, the primary particles of carbon form secondary particles in the sintered body. The C in the form of secondary particles is formed as compressed clusters of primary particles of C, and primary particles of C present inside the secondary particles are not covered with the FePt alloy. Therefore, it is considered that the primary particles of C present inside the secondary particles may easily fall off the target as clusters during sputtering to thereby facilitate the formation of

TABLE 1

|  | | C powder used | | | C phase in sintered body | | Number of |
| --- | --- | --- | --- | --- | --- | --- | --- |
|  | Composition | Average particle diameter (μm) | Shape | Relative density (%) | Average value of the size indices a (μm) | Average value of the nonspherical indices b | particles after lapse of 2 hours |
| Example 1 | (Fe—50Pt)—39.5C | 12.17 | nonspherical | 95.82 | 5.3 | 4.5 | 80 |
| Example 2 | (Fe—50Pt)—39.5C | 19.93 | nonspherical | 95.20 | 6.3 | 5.2 | 48 |
| Example 3 | (Fe—50Pt)—39.5C | 51.01 | nonspherical | 96.54 | 7.6 | 6.0 | 55 |
| Example 4 | (Fe—50Pt)—30C—10SiO$_2$ | 19.93 | nonspherical | 94.37 | 5.4 | 5.6 | 17 |
| Comparative Example 1 | (Fe—50Pt)—39.5C | 6.63 | spherical | 96.07 | 6.6 | 2.0 | 186 |
| Comparative Example 2 | (Fe—50Pt)—39.5C | 22.55 | spherical | 97.11 | 9.7 | 2.5 | 110 |
| Comparative Example 3 | (Fe—50Pt)—39.5C | 5.09 | nonspherical | 94.37 | 3.7 | 3.9 | 360 |
| Comparative Example 4 | (Fe—50Pt)—39.5C | 0.03 | nonspherical | 96.12 | 0.8 | 3.5 | 4807 |

In Examples 1 to 4 which fall within the scope of the present invention, the average value of the size indices a of the C phase in the sintered body is 4.0 μm or more and 9.0 μm or less, and the average value of the nonspherical indices b of the C phase in the sintered body is 3.0 or more.

Since the average value of the size indices a of the C phase in the sintered body of Examples 1 to 4 is 4.0 μm or more and 9.0 μm or less, the periphery of the C phase may have an appropriate size that is likely to be covered with the FePt-based alloy, which is the matrix metal. Since the average value of the nonspherical indices b of the C phase in the sintered body is 3.0 or more, the C phase in the target has a long thin shape compared to the spherical shape, and thus the surface area per unit volume is increased more than the spherical shape. Accordingly, the C phase in the target is likely to be favorably bonded to the FePt-based alloy, which is the matrix metal.

Thus, it is considered that the number of particles generated in Examples 1 to 4 is reduced.

In contrast, the average values of the nonspherical indices b of the C phase in the sintered bodies of Comparative Examples 1 and 2 are 2.0 and 2.5, respectively, which are both below 3.0, meaning that the shape of the C phase in the sintered body is close to a spherical shape. Thus, the surface areas per unit volume of the C phase in the sintered bodies of Comparative Examples 1 and 2 are reduced, and the bonding of the C phase to the FePt-based alloy, which is the matrix metal, is diminished. Accordingly, it is considered that the number of particles generated is increased compared to Examples 1 to 4.

In Comparative Examples 3 and 4, the average values of the size indices a of the C phase in the sintered bodies are 3.7 μm and 0.8 μm, respectively, which are below 4.0 μm, particles. This may be the reason that the number of particles generated when the sputtering target of Comparative Example 4 was used to perform sputtering was much larger than those in Examples 1 to 4 and Comparative Examples 1 to 3.

INDUSTRIAL APPLICABILITY

The sputtering target according to the present invention is an FePt—C-based sputtering target that alone can be used to form a thin film containing an FePt-based alloy and carbon, the thin film being capable of being used as a magnetic recording medium, without using a plurality of targets, and that causes a reduced amount of particles during sputtering. Thus, the sputtering target according to the present invention has industrial applicability.

The invention claimed is:

1. An FePt—C-based sputtering target containing Fe, Pt, and C, wherein
the FePt—C-based sputtering target has a structure in which a C phase substantially being C is dispersed in an FePt-based alloy phase containing 33 mol % or more and 60 mol % or less of Pt with the balance substantially being Fe, and
when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

2. An FePt—C-based sputtering target containing Fe, Pt, and C and further containing at least one element other than Fe and Pt, wherein
the FePt—C-based sputtering target has a structure in which a C phase substantially being C is dispersed in an FePt-based alloy phase containing 33 mol % or more and less than 60 mol % of Pt and more than 0 mol % and 20 mol % or less of the at least one element other than Fe and Pt with the balance substantially being Fe and with the total amount of Pt and the at least one element being 60 mol % or less, and
when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

3. The FePt—C-based sputtering target according to claim 2, wherein
the at least one element other than Fe and Pt are one or more kinds of Cu, Ag, Rh, Au, Mn, Ni, Co, Pd, Cr, V, and B.

4. The FePt—C-based sputtering target according to claim 1, wherein a content percentage of C in the C phase relative to the entire target is 10 mol % or more and 60 mol % or less.

5. An FePt—C-based sputtering target containing Fe, Pt, C, and oxide, wherein
the FePt—C-based sputtering target has a structure in which a C phase substantially being C and an oxide phase substantially being oxide are dispersed in an FePt-based alloy phase containing 33 mol % or more and 60 mol % or less of Pt with the balance substantially being Fe, and
when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

6. An FePt—C-based sputtering target containing Fe, Pt, C, and oxide and further containing at least one element other than Fe and Pt, wherein
the FePt—C-based sputtering target has a structure in which a C phase substantially being C and an oxide phase substantially being oxide are dispersed in an FePt-based alloy phase containing 33 mol % or more and less than 60 mol % of Pt and more than 0 mol % and 20 mol % or less of the at least one element other than Fe and Pt with the balance being Fe and unavoidable impurities and with the total amount of Pt and the at least one element being 60 mol % or less, and
when in each of 10 images taken at 10 locations in a cross section of the FePt—C-based sputtering target in a thickness direction thereof with a field of view having a size of 121 μm×97 μm taken with 1,000× magnification, an average value of diameters of five inscribed circles from a largest diameter to a fifth largest diameter of inscribed circles of the C phase is regarded as a size index a of the C phase, and a value L/R for each C phase from the largest diameter to the fifth largest diameter of the inscribed circles is determined by dividing a maximum length L of a straight line among straight lines connecting a center of each of the five inscribed circles of the C phase from the largest diameter to the fifth largest diameter to an interface of the C phase by a radius R of the inscribed circle associated with the maximum length L, and an average value of the resulting five values L/R is regarded as a nonspherical index b of the C phase, an average value of the size indices a of the C phase obtained for the respective 10 images is 4.0 μm or more and 9.0 μm or less, and an average value of the nonspherical indices b of the C phase determined for the respective 10 images is 3.0 or more.

7. The FePt—C-based sputtering target according to claim 6, wherein
the at least one element other than Fe and Pt are one or more kinds of Cu, Ag, Rh, Au, Mn, Ni, Co, Pd, Cr, V, and B.

8. The FePt—C-based sputtering target according to claim 5, wherein
a content percentage of a total sum of C in the C phase and the oxide in the oxide phase relative to the entire target is 10 mol % or more and 60 mol % or less, a content percentage of C in the C phase relative to the entire target is 5 mol % or more and 50 mol % or less, and a content percentage of the oxide in the oxide phase relative to the entire target is 1 mol % or more and 25 mol % or less.

9. The FePt—C-based sputtering target according to claim 5, wherein the oxide contains at least one $SiO_2$, $TiO_2$, $Ti_2O_3$, $Ta_2O_5$, $Cr_2O_3$, CoO, $Co_3O_4$, $B_2O_3$, $Fe_2O_3$, $Fe_3O_4$, CuO, $Cu_2O$, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

10. The FePt—C-based sputtering target according to claim 1, wherein the sputtering target has a relative density of 90% or larger.

11. The FePt—C-based sputtering target according to claim 2, wherein a content percentage of C in the C phase relative to the entire target is 10 mol % or more and 60 mol % or less.

12. The FePt—C-based sputtering target according to claim 3, wherein a content percentage of C in the C phase relative to the entire target is 10 mol % or more and 60 mol % or less.

13. The FePt—C-based sputtering target according to claim 6, wherein a content percentage of a total sum of C in the C phase and the oxide in the oxide phase relative to the entire target is 10 mol % or more and 60 mol % or less, a content percentage of C in the C phase relative to the entire target is 5 mol % or more and 50 mol % or less, and a content percentage of the oxide in the oxide phase relative to the entire target is 1 mol % or more and 25 mol % or less.

14. The FePt—C-based sputtering target according to claim 7, wherein a content percentage of a total sum of C in the C phase and the oxide in the oxide phase relative to the entire target is 10 mol % or more and 60 mol % or less, a content percentage of C in the C phase relative to the entire target is 5 mol % or more and 50 mol % or less, and a content percentage of the oxide in the oxide phase relative to the entire target is 1 mol % or more and 25 mol % or less.

15. The FePt—C-based sputtering target according to claim 6, wherein the oxide contains at least one $SiO_2$, $TiO_2$, $Ti_2O_3$, $Ta_2O_5$, $Cr_2O_3$, CoO, $Co_3O_4$, $B_2O_3$, $Fe_2O_3$, $Fe_3O_4$, CuO, $Cu_2O$, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

16. The FePt—C-based sputtering target according to claim 7, wherein the oxide contains at least one of $SiO_2$, $TiO_2$, $Ti_2O_3$, $Ta_2O_5$, $Cr_2O_3$, CoO, $Co_3O_4$, $B_2O_3$, $Fe_2O_3$, $Fe_3O_4$, CuO, $Cu_2O$, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

17. The FePt—C-based sputtering target according to claim 2, wherein the sputtering target has a relative density of 90% or larger.

18. The FePt—C-based sputtering target according to claim 3, wherein the sputtering target has a relative density of 90% or larger.

19. The FePt—C-based sputtering target according to claim 5, wherein the sputtering target has a relative density of 90% or larger.

20. The FePt—C-based sputtering target according to claim 6, wherein the sputtering target has a relative density of 90% or larger.

* * * * *